(12) United States Patent
Kim et al.

(10) Patent No.: US 12,183,828 B2
(45) Date of Patent: Dec. 31, 2024

(54) THIN FILM TRANSISTOR AND DISPLAY APPARATUS COMPRISING THE SAME

(71) Applicant: LG Display Co., Ltd., Seoul (KR)

(72) Inventors: Sunggu Kim, Paju-si (KR); DaeHwan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 451 days.

(21) Appl. No.: 17/546,719

(22) Filed: Dec. 9, 2021

(65) Prior Publication Data

US 2022/0199829 A1    Jun. 23, 2022

(30) Foreign Application Priority Data

Dec. 23, 2020   (KR) .................. 10-2020-0182551

(51) Int. Cl.
  *H01L 29/786*     (2006.01)
  *H01L 29/24*      (2006.01)
(52) U.S. Cl.
  CPC .......... *H01L 29/7869* (2013.01); *H01L 29/24* (2013.01)
(58) Field of Classification Search
  None
  See application file for complete search history.

(56) References Cited

U.S. PATENT DOCUMENTS

| | | | |
|---|---|---|---|
| 2014/0197408 A1* | 7/2014 | Tsuruma | C23C 14/086 257/43 |
| 2014/0203275 A1* | 7/2014 | Kim | H01L 29/7869 257/43 |
| 2014/0291669 A1* | 10/2014 | Ji | H01L 29/4908 257/43 |
| 2019/0035939 A1 | 1/2019 | Yamazaki | |
| 2020/0144347 A1 | 5/2020 | Seo et al. | |
| 2022/0209019 A1* | 6/2022 | Baeck | H01L 29/78648 |

FOREIGN PATENT DOCUMENTS

| | | |
|---|---|---|
| KR | 10-2020-0034457 A | 3/2020 |
| KR | 10-2020-0037906 A | 4/2020 |
| KR | 10-2020-0052592 A | 5/2020 |

OTHER PUBLICATIONS

Korean Intellectual Property Administration, Office Action, Korean Patent Application No. 10-2020-0182551, Sep. 20, 2024, 17 pages.

* cited by examiner

*Primary Examiner* — Sarah K Salerno
(74) *Attorney, Agent, or Firm* — Fenwick & West LLP

(57) ABSTRACT

A thin film transistor and a display apparatus comprising the same are provided, in which the thin film transistor comprises an active layer, a barrier layer on the active layer; a gate insulating layer on the barrier layer; and a gate electrode on the gate insulating layer, wherein at least a portion of the gate electrode overlaps at least a portion of the active layer, and the barrier layer includes an oxide semiconductor material and has a resistivity greater than a resistivity of the active layer and has a thickness less than a thickness of the active layer.

28 Claims, 11 Drawing Sheets

THIN FILM TRANSISTOR AND DISPLAY APPARATUS COMPRISING THE SAME

CROSS-REFERENCE TO RELATED APPLICATION

This application claims the benefit of the Republic of Korea Patent Application No. 10-2020-0182551 filed on Dec. 23, 2020, which is hereby incorporated by reference in its entirety.

BACKGROUND

Field of Technology

The present disclosure relates to a thin film transistor and a display apparatus comprising the same.

Discussion of the Related Art

Since a thin film transistor may be manufactured on a glass substrate or a plastic substrate, the thin film transistor has been widely used as a switching element or a driving element of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer, or an oxide semiconductor thin film transistor in which oxide semiconductor is used as an active layer, based on a material constituting the active layer.

Since amorphous silicon may be deposited in a short time to form an active layer, an amorphous silicon thin film transistor (a-Si TFT) has advantages in that a manufacturing process time is short and a production cost is low. On the other hand, the amorphous silicon thin film transistor has a drawback in that it is restrictively used for an active matrix organic light emitting diode (AMOLED) because a current driving capacity is not sufficient due to low mobility and there is a change in a threshold voltage.

A polycrystalline silicon thin film transistor (poly-Si TFT) is made by depositing amorphous silicon and crystallizing the deposited amorphous silicon. The polycrystalline silicon thin film transistor has advantages in that electron mobility is high, stability is excellent, thin profile and high resolution may be embodied and power efficiency is high. Examples of the polycrystalline silicon thin film transistor include a low temperature poly silicon (LTPS) thin film transistor and a polysilicon thin film transistor. However, since a process of manufacturing the polycrystalline silicon thin film transistor needs a step of crystallizing the amorphous silicon, a manufacturing cost is increased due to the increased number of the process steps and crystallization is required at a high temperature. Therefore, it is difficult to apply the polycrystalline silicon thin film transistor to a large-sized display device.

An oxide semiconductor thin film transistor (TFT), which has high mobility and has a large resistance change in accordance with an oxygen content, has an advantage in that desired properties may easily be obtained. Further, since an oxide constituting an active layer may be grown at a relatively low temperature during a process of manufacturing the oxide semiconductor thin film transistor, the manufacturing cost of the oxide semiconductor thin film transistor is reduced. Furthermore, in view of the properties of oxide, since an oxide semiconductor is transparent, it is favorable to embody a transparent display. However, the oxide semiconductor thin film transistor has a problem in that stability and mobility are deteriorated as compared with the polycrystalline silicon thin film transistor.

In order to develop a display device of high quality and improve mobility of an oxide semiconductor thin film transistor, studies using high mobility materials are ongoing. However, when the high mobility material is used, a problem may occur in that reliability and stability of the oxide semiconductor thin film transistor are deteriorated. Therefore, it is required to improve driving stability of the oxide semiconductor thin film transistor in which the high mobility material is used.

SUMMARY

The present disclosure has been made in view of the above problems and it is an object of the present disclosure to provide a thin film transistor having improved driving stability due to arrangement of a barrier layer including an oxide semiconductor material.

It is another object of the present disclosure to provide a thin film transistor having improved interface stability between a gate insulating film and an active layer as a barrier layer made of an oxide semiconductor material, having a thin profile and high resistance, is disposed on the active layer.

It is still another object of the present disclosure to provide a thin film transistor having excellent driving stability since equipped with a barrier layer of a thin film, which is made of an oxide semiconductor material and has a high oxygen concentration.

It is further still another object of the present disclosure to provide a display apparatus comprising the thin film transistor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising an active layer, a barrier layer on the active layer, a gate insulating layer on the barrier layer, and a gate electrode on the gate insulating layer, wherein at least a portion of the gate electrode overlaps at least a portion of the active layer, and the barrier layer includes an oxide semiconductor material and has a resistivity that is greater than a resistivity of the active layer and has a thickness that is less than a thickness of the active layer.

In one embodiment, a thin film transistor comprises: an active layer including an oxide semiconductor material; a barrier layer on the active layer, wherein the barrier layer is a distinct layer from the active layer; a gate insulating layer on the barrier layer; and a gate electrode on the gate insulating layer, wherein at least a portion of the gate electrode overlaps at least a portion of the active layer, and the barrier layer includes an oxide semiconductor material having a carrier concentration that is less than a carrier concentration of the oxide semiconductor material included in the active layer.

In accordance with another aspect of the present disclosure, the above and other objects can be accomplished by the provision of a display apparatus comprising the above thin film transistor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
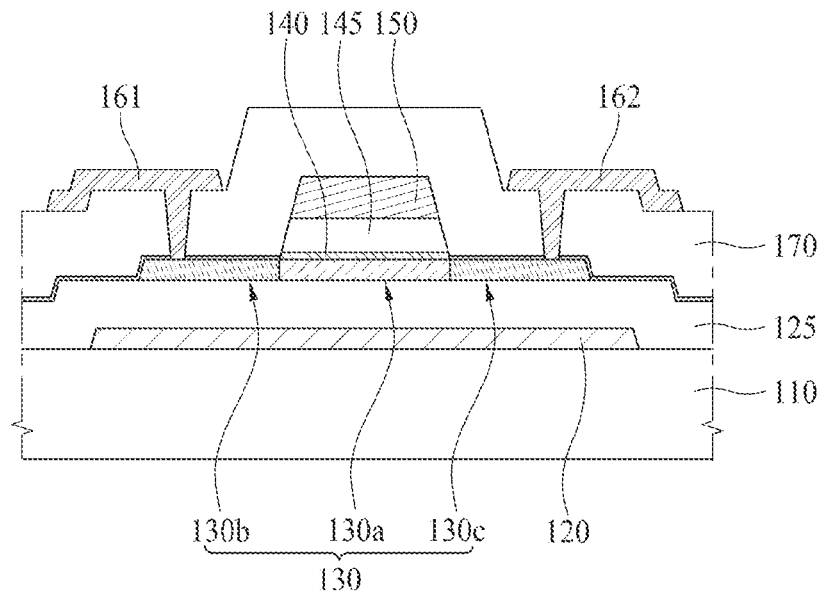
FIG. 1 is a cross-sectional view illustrating a thin film transistor according to one embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

Spatially relative terms such as "below", "beneath", "lower", "above" and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below" or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

In the drawings, the same or similar elements are denoted by the same reference numerals even though they are depicted in different drawings. Wherever possible, the same reference numbers will be used throughout the drawings to refer to the same or like parts.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source area is distinguished from a source electrode and a drain area is distinguished from a drain electrode. However, the embodiments of the present disclosure are not limited to this structure. For example, the source area may be the source electrode and the drain area may be the drain electrode. Also, the source area may be the drain electrode, and the drain area may be the source electrode.

FIG. 1 is a cross-sectional view illustrating a thin film transistor 100 according to one embodiment of the present disclosure.

The thin film transistor 100 according to one embodiment of the present disclosure includes an active layer 130, a barrier layer 140, a gate insulating layer 145, and a gate electrode 150.

Referring to FIG. 1, the active layer 130 is disposed on a substrate 110.

A glass substrate or a polymer resin substrate may be used as the substrate 110. There is a plastic substrate as the polymer resin substrate. The plastic substrate may include at least one of polyimide (PI), polycarbonate (PC), polyethylene (PE), polyester, polyethylene terephthalate (PET) or polystyrene (PS), which has flexible properties.

A light shielding layer 120 may be disposed on the substrate 110. The light shielding layer 120 has a light shielding characteristic. The light shielding layer 120 may shield light incident from the substrate 110 to protect the active layer 130. The light shielding layer 120 may be omitted.

A buffer layer 125 is disposed on the light shielding layer 120. The buffer layer 125 covers an upper surface of the substrate 110 and an upper surface of the light shielding layer 120. The buffer layer 125 has insulation properties and protects the active layer 130. The buffer layer 125 may be omitted.

The active layer 130 is disposed on the buffer layer 125.

According to one embodiment of the present disclosure, the active layer 130 includes an oxide semiconductor material. According to one embodiment of the present disclosure, the active layer 130 is an oxide semiconductor layer made of an oxide semiconductor material, for example.

The active layer 130 may include at least one of ZO(ZnO)-based, IZO(InZnO)-based, IGZO(InGaZnO)-based, TO(SnO)-based, IGO(InGaO)-based, ITO(InSnO)-based, IGZTO(InGaZnSnO)-based, GZTO(GaZnSnO)-based, GZO(GaZnO)-based, GO(GaO)-based, IO(InO)-based or ITZO(InSnZnO) oxide semiconductor material. In more detail, the active layer 130 may include at least one of ZO(ZnO)-based, IZO(InZnO)-based, IGZO(InGaZnO)-based, IGZTO(InGaZnSnO)-based, FIZO(FeInZnO)based, or TO(SnO)-based oxide semiconductor material. For example, the active layer 130 may include FIZO(FeInZnO)-based oxide semiconductor material.

The active layer 130 may have a single layered structure, and may have a multi-layered structure that includes two or more oxide semiconductor layers.

According to one embodiment of the present disclosure, the active layer 130 includes a channel portion 130a, a first connection portion 130b and a second connection portion 130c. The first connection portion 130b and the second connection portion 130c may be formed by selective conductorization of the active layer 130. The first connection portion 130b and the second connection portion 130c are generally disposed on both sides of the channel portion 130a.

The channel portion 130a has a semiconductor characteristic. According to one embodiment of the present disclosure, the channel portion 130a overlaps the light shielding layer 120.

The barrier layer 140 is disposed on the active layer 130. The barrier layer 140 may fully cover an upper surface of the active layer 130, and may partially cover the active layer 130. The barrier layer 140 is disposed on the channel portion 130a of the active layer 130 to protect the channel portion 130a.

The barrier layer 140 includes an oxide semiconductor material, and has resistivity greater than a resistivity of the active layer 130. The barrier layer 140 may have the same or similar metal composition as that of the active layer 130. The barrier layer 140 has a thickness that is less than a thickness of the active layer 130. The barrier layer 140 will be described below with reference to FIG. 2.

The gate insulating layer 145 is disposed on the barrier layer 140. The gate insulating layer 145 may include at least one of silicon oxide or silicon nitride. The gate insulating layer 145 may have a single layered structure, and may have a multi-layered structure. In addition, the gate insulating layer 145 may be patterned and disposed only on a portion of the active layer 130, may be disposed to fully cover the active layer 130, or may be disposed to fully cover the upper surface of the substrate 110.

The gate electrode 150 is disposed on the gate insulating layer 145. The gate electrode 150 is spaced apart from the active layer 130 and at least partially overlaps the active layer 130. At least a portion of the gate electrode 150 overlaps at least a portion of the active layer 130. The gate electrode 150 overlaps the channel portion 130a of the active layer 130.

The gate electrode 150 may include at least one of aluminum-based metals such as aluminum (Al) or aluminum alloy, silver-based metals such as silver (Ag) or silver alloy, copper-based metals such as copper (Cu) or copper alloy, molybdenum-based metals such as molybdenum (Mo) or molybdenum alloy, chromium (Cr), tantalum (Ta), neodymium (Nd) or titanium (Ti). The gate electrode 150 may have a multi-layered structure that includes at least two conductive layers having their respective physical properties different from each other.

According to one embodiment of the present disclosure, the active layer 130 may selectively be conductorized by selective conductorization using the gate electrode 150 as a mask.

An area of the active layer 130, which is overlapped with the gate electrode 150, is not conductorized, and thus becomes the channel portion 130a. Areas of the active layer 130, which are not overlapped with the gate electrode 150, are conductorized and thus become the first connection portion 130b and the second connection portion 130c.

According to one embodiment of the present disclosure, the active layer 130 may selectively be conductorized by, for example, a plasma treatment or a dry etch, but one embodiment of the present disclosure is not limited thereto. The active layer 130 may selectively be conductorized by doping using a dopant. At this time, the doped area is conductorized. For doping, doping may be performed by at least one of, for example, boron (B) ions, phosphorus (P) ions, arsenic (As) ions or antimony (Sb) ions. In addition, the active layer 130 may selectively be conductorized by light irradiation.

According to one embodiment of the present disclosure, any one of the first connection portion 130b and the second connection portion 130c may be a source area, and the other one thereof may be a drain area. The source area serves as a source connection portion connected with a source electrode 161. The drain area serves as a drain connection portion connected with a drain electrode 162.

The first connection portion 130b and the second connection portion 130c shown in the drawings are distinguished for each other for convenience of description, and the first connection portion 130b and the second connection portion 130c may be used interchangeably. According to one embodiment of the present disclosure, the first connection portion 130b may be a source area, and the second connection portion 130c may be a drain area. In addition, the first connection portion 130b may be a drain area, and the second connection portion 130c may be a source area.

According to one embodiment of the present disclosure, the first connection portion 130b may serve as a source electrode, and may serve as a drain electrode. In addition, the second connection portion 130c may serve as a drain electrode, and may serve as a source electrode.

An interlayer dielectric layer 170 is disposed on the gate electrode 150. The interlayer dielectric layer 170 is an insulating layer made of an insulating material. In detail, the interlayer dielectric layer 170 may be made of an organic material or an inorganic material, or may be made of a deposited body of an organic layer and an inorganic layer.

The source electrode 161 and the drain electrode 162 are disposed on the interlayer dielectric layer 170. The source electrode 161 and the drain electrode 162 are spaced apart from each other and connected with the active layer 130, respectively. The source electrode 161 and the drain electrode 162 may be connected with the active layer 130 through a contact hole that passes through the interlayer dielectric layer 170 and the barrier layer 140.

Each of the source electrode 161 and the drain electrode 162 may include at least one of molybdenum (Mo), aluminum (Al), chromium (Cr), gold (Au), titanium (Ti), nickel (Ni), neodymium (Nd), copper (Cu) or alloy thereof. Each of the source electrode 161 and the drain electrode 162 may be formed of a single layer made of a metal or a metal alloy, or may be formed of two or more layers.

Hereinafter, the barrier layer 140 will be described in detail with reference to FIG. 2.

Figure 2:
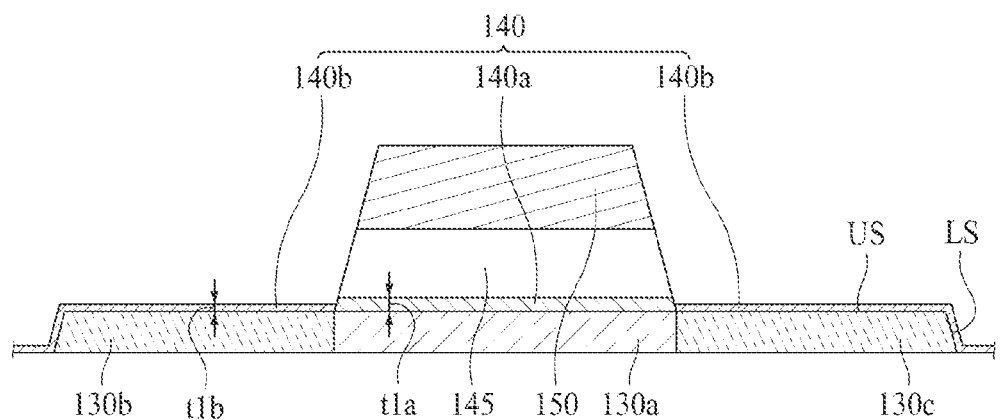
FIG. 2 is a detailed view illustrating a portion of FIG. 1 according to one embodiment of the present disclosure.

FIG. 2 is a detailed view of a portion of FIG. 1 according to one embodiment. In detail, FIG. 2 is a detailed view of the active layer 130, the barrier layer 140, the gate insulating layer 145 and the gate electrode 150 of FIG. 1.

Referring to FIG. 2, the gate insulating layer 145 according to one embodiment of the present disclosure may be patterned. For example, the gate insulating layer 145 may be patterned in a shape corresponding to the gate electrode 150.

The barrier layer 140 is disposed between the active layer 130 and the gate insulating layer 145.

Referring to FIGS. 1 and 2, the barrier layer 140 covers an upper surface US and a lateral surface LS of the active layer 130. In detail, the barrier layer 140 may be disposed on the upper surface US and the lateral surface LS of the active layer 130.

According to one embodiment of the present disclosure, the upper surface US of the active layer 130 refers to a surface of the active layer 130, which is directed toward an opposite direction of the substrate 110. The surface of the active layer 130, which is directed toward the substrate 110, is referred to as a rear surface. The lateral surface LS of the active layer 130 refers to the surface of the active layer 130 between the upper surface US and the rear surface.

According to one embodiment of the present disclosure, the barrier layer 140 may be extended to the outside of the active layer 130. Referring to FIGS. 1 and 2, the barrier layer 140 may be extended from the upper surface US and the lateral surface LS of the active layer 130, and may be disposed outside the active layer 130. According to one embodiment of the present disclosure, the barrier layer 140 may be disposed on the entire surface of the substrate 110, including the upper surface US and the lateral surface LS of the active layer 130.

Areas of the barrier layer 140 may be identified depending on whether the barrier layer 140 overlaps the gate electrode 150. According to one embodiment of the present disclosure, the barrier layer 140 may include a first area 140a that overlaps the gate electrode 150, and a second area 140b that does not overlap the gate electrode 150.

The barrier layer 140 may be made of an oxide semiconductor material.

According to one embodiment of the present disclosure, the barrier layer 140 may include at least one of IGZO (InGaZnO)-based oxide semiconductor material, IGO(InGaO)-based oxide semiconductor material, IGZTO(InGaZnSnO)-based oxide semiconductor material, GZTO(InGaZnSnO)-based oxide semiconductor material, GZO (GaZnO)-based oxide semiconductor material, or GO(GaO)-based oxide semiconductor material.

The barrier layer 140 according to one embodiment of the present disclosure includes an oxide semiconductor material, but has electrical characteristics similar to the insulating layer.

The barrier layer 140 has resistance greater than a resistance of the active layer 130.

According to one embodiment of the present disclosure, the barrier layer 140 has resistivity greater than a resistance of the active layer 130. According to one embodiment of the present disclosure, the barrier layer 140 does not increase a carrier concentration or mobility of the active layer 130 but improves electrical stability of the active layer 130 and the thin film transistor 100.

The barrier layer 140 has resistivity greater than a resistivity of the active layer 130 and is thinner than the active layer 130 so as not to affect the electrical characteristics of the active layer 130.

According to one embodiment of the present disclosure, the barrier layer 140 has an oxygen atom concentration higher than that of the active layer 130. The barrier layer 140 may include oxygen of a high concentration by increasing an oxygen partial pressure in the step of manufacturing the barrier layer 140.

For example, when the barrier layer 140 is formed by deposition, the oxygen partial pressure of the barrier layer 140 may be 50% or more. In more detail, the barrier layer 140 may be formed by deposition under the condition of the oxygen partial pressure of 50% to 75%.

Since the barrier layer 140 has an oxygen atom concentration higher than that of the active layer 130, the barrier layer 140 may have resistivity higher than that of the active layer 130.

According to one embodiment of the present disclosure, the barrier layer 140 includes metal atoms and oxygen atoms, wherein the number of oxygen atoms may be 1.2 to 2.5 times of a total number of metal atoms. In more detail, the total number of oxygen atoms included in the barrier layer 140 may be 1.5 to 2.5 times of the total number of metal atoms. According to one embodiment of the present disclosure, when the barrier layer 140 includes oxygen of 1.5 to 2.5 times of the number of metal atoms, the metals included in the barrier layer 140 may be subjected to a stable coupling with oxygen in a stoichiometric manner.

The barrier layer 140 containing indium (In), zinc (Zn), gallium (Ga) and tin (Sn) as metal atoms will be described as an example. Indium (In), zinc (Zn), gallium (Ga) and tin (Sn), which are contained in the barrier layer 140, may be combined with oxygen in the form of $In_2O_3$, $ZnO$, $ZnO_2$, $GaO$, $Ga_2O_3$, $GaO_2$, and $SnO_2$. Considering stoichiometry when indium (In), zinc (Zn), gallium (Ga) and tin (Sn), which are contained in the barrier layer 140, are combined with oxygen to form an oxide, the number of oxygen atoms is 1.5 times to 2.5 times of the number of metal atoms, and the metals contained in the barrier layer 140 may have a composition with oxygen in a stoichiometric stable state. As a result, the barrier layer 140 may have excellent chemical stability.

According to one embodiment of the present disclosure, the barrier layer 140 has resistivity of $1.0 \times 10^6 \Omega \cdot cm$ or more. According to one embodiment of the present disclosure, the active layer 130 may have resistivity of $1.0 \times 10^6 \Omega \cdot cm$ or less. In more detail, the channel portion 130a may have resistivity of $1.0 \times 10^6 \Omega \cdot cm$ or less. According to one embodiment of the present disclosure, the barrier layer 140 has resistivity greater than a resistivity of the active layer 130.

In addition, the barrier layer 140 according to one embodiment of the present disclosure, which has a high oxygen concentration, has a low carrier concentration. According to one embodiment of the present disclosure, the barrier layer 140 has a carrier concentration lower than a carrier concentration of the active layer 130.

According to one embodiment of the present disclosure, the barrier layer 140 may have a carrier concentration of $1.0 \times 10^{17}$ ea/$cm^3$ or less. On the other hand, the active layer 130 may have a carrier concentration of $1.0 \times 10^{17}$ ea/$cm^3$ or more. In more detail, the channel portion 130a may have a carrier concentration of $1.0 \times 10^{17}$ ea/$cm^3$ or more. When an oxide semiconductor material of high mobility is used, the channel portion 130a may have a carrier concentration of $1.0 \times 10^{18}$ ea/$cm^3$ or more. For example, when IGZTO(InGaZnSnO)-based oxide semiconductor material or FIZO (FeInZnO)-based oxide semiconductor material is used, the channel portion 130a may have a carrier concentration of $1.0 \times 10^{18}$ ea/$cm^3$ or more.

According to one embodiment of the present disclosure, the barrier layer 140 may have mobility of 2 $cm^2$/V·s or less. In more detail, the barrier layer 140 may have mobility of 1.5 $cm^2$/V·s or less, or may have mobility of 1 $cm^2$/V·s or less. For example, the barrier layer 140 may have mobility of 0.01 $cm^2$/V·s to 2 $cm^2$/V·s, may have mobility of 0.1 $cm^2$/V·s to 2 $cm^2$/V·s, or may have mobility of 0.5 $cm^2$/V·s to 2 $cm^2$/V·s.

The active layer 130 may have mobility of 5 $cm^2$/V·s or more. In more detail, the active layer 130 may have mobility of 10 $cm^2$/V·s or more. For example, the active layer 130 may have mobility of 5 $cm^2$/V·s to 40 $cm^2$/V·s 5. In addition, according to one embodiment of the present disclosure, the channel portion 130a may have mobility of 5 $cm^2$/V·s or more, or may have mobility of 10 $cm^2$/V·s or more. For example, the channel portion 130a may have mobility of 5 $cm^2$/V·s to 40 $cm^2$/V·s. When the oxide semiconductor material of high mobility is used, the channel portion 130a may have mobility of 20 $cm^2$/V·s to 40 $cm^2$/V·s.

As described above, the barrier layer 140 according to one embodiment of the present disclosure has greater resistivity, lower carrier concentration and lower mobility than the active layer 130 and thus may not contribute greatly to improving ON-current characteristics of the active layer 130.

Since the barrier layer 140 according to one embodiment of the present disclosure is made of an oxide semiconductor material, the barrier layer 140 may have a composition similar to that of the oxide semiconductor material constituting the active layer 130. Therefore, the barrier layer 140 and the active layer 130 have excellent interfacial properties, and the interface between the barrier layer 140 and the active layer 130 is very stable. Further, since the barrier layer 140 has electrical or chemical properties close to the insulator, the barrier layer 140 may form a stable interface with the gate insulating layer 145 made of an insulating material.

According to one embodiment of the present disclosure, the carrier concentration and mobility of the barrier layer 140 are less than the carrier concentration and mobility of the active layer 130. In more detail, the carrier concentration and mobility of the barrier layer 140 are less than the carrier concentration and mobility of the channel portion 130a. The barrier layer 140 is insensitive to factors that affect stability of the thin film transistor 100 compared to the channel portion 130a. Therefore, the barrier layer 140 may protect the active layer 130 and the channel portion 130a from external factors that affect electrical characteristics of the active layer 130 and the channel portion 130a.

For example, even though oxygen (O) or hydrogen (H), which is an external factor affecting electrical characteristics of the thin film transistor 100, is permeated into the barrier layer 140, there is no big change in the electrical characteristics of the barrier layer 140. Also, even though the change in electrical characteristics occurs in the barrier layer 140, since the barrier layer 140 is thin, the change in electrical characteristics of the barrier layer 140 does not affect electrical characteristics of the active layer 130 and the channel portion 130a. As such, the barrier layer 140 serves to protect the active layer 130 and the channel portion 130a from the external factors. As a result, electrical stability of the active layer 130, particularly the channel portion 130a may be improved due to the barrier layer 140.

In order to improve mobility of the thin film transistor, which includes the active layer 130 made of the oxide semiconductor, when an oxide semiconductor material of high mobility such as FIZO(FeInZnO), IGZTO(InGaZnSnO), and IZO(InZnO) is used, stability of the active layer 130 may be deteriorated due to external environmental factors such as, for example, light irradiation, external temperature change and etc., whereby a problem may occur in that a threshold voltage of the thin film transistor is changed. Since the barrier layer 140 according to one embodiment of the present disclosure has a composition similar to that of the oxide semiconductor material of high mobility, when the barrier layer 140 is disposed on the active layer 130, stability of the active layer 130 may be improved without deterioration of electrical characteristics of the active layer 130.

In addition, the barrier layer 140 has insulation properties and has electrical chemical characteristics similar to those of the insulator, thereby the barrier layer 140 can maintain strong coupling with the gate insulating layer 145. As described above, the barrier layer 140 is disposed between the active layer 130 and the gate insulating layer 145 to serve as an intermediate for preventing or at least reducing a property of a material from being rapidly changed. As a result, defects may be prevented or at least reduced from occurring between the active layer 130 and the gate insulating layer 145 due to a difference in physical or chemical properties.

In addition, an energy barrier may exist between the barrier layer 140 and the active layer 130 due to a gap existing between valance bands of the barrier layer 140 and the active layer 130. Therefore, when the barrier layer 140 is disposed between the active layer 130 and the gate insulating layer 145, it is not likely that holes formed in the active layer 130 will be trapped in the gate insulating layer 145, due to the energy barrier between the barrier layer 140 and the active layer 130. Therefore, the active layer 130 may be prevented from being degraded and from being unstable.

When the barrier layer 140 does not exist and a voltage, for example, a negative (−) voltage is applied to the gate electrode 140 in a state that light is irradiated to the active layer 130, an electron-hole pair may be formed in the active layer 130, and the electron-hole pair formed therein may be trapped on the interface between the active layer 130 and the gate insulating layer 145. In this case, electrical stability of the active layer 130 and the thin film transistor 100 including the active layer 130 may be deteriorated.

Since the barrier layer 140 according to one embodiment of the present disclosure has high electrical resistance and is thin, the barrier layer 140 may not directly affect the electrical characteristics of the active layer 130. Although the barrier layer 140 is disposed on the active layer 130, mobility or carrier concentration of the active layer 130 may not be substantially changed. As a result, it is possible to reduce influence of the barrier layer 140 onto the electric characteristics of the thin film transistor 100.

In addition, the barrier layer 140 according to one embodiment of the present disclosure may serve to block damage and stress applied to the active layer 130 during the process. For example, since the barrier layer 140 is disposed on the active layer 130, the active layer 130 may be prevented from being contaminated by a photoresist during an etching process, and the active layer 130 may be prevented from being damaged during the etching process or a strip process. As a result, stability of the active layer 130 may be improved.

According to one embodiment of the present disclosure, the barrier layer 140 may have a predetermined thickness so as not to affect electrical characteristics of the active layer 130 and to block damage and stress applied to the active layer 130.

According to one embodiment of the present disclosure, the barrier layer 140 may have a thickness of 0.5 nm to 5 nm.

When the thickness of the barrier layer 140 is less than 0.5 nm, the barrier layer 140 may not sufficiently protect the active layer 130 due to its thin thickness. In addition, when the thickness of the barrier layer 140 is designed to be less than 0.5 nm, process stability for forming the barrier layer 140 may be deteriorated. Therefore, according to one embodiment of the present disclosure, the thickness of the barrier layer 140 may be designed to be 0.5 nm or more.

On the other hand, even though the barrier layer 140 has high resistivity, when the barrier layer 140 is thick, a flow of charges through the barrier layer 140 may occur. In detail, when the thickness of the barrier layer 140 is increased, an electron-hole pair is formed in the barrier layer 140, and the electron-hole pair formed therein may be trapped on the interface between the barrier layer 140 and the gate insulating layer 145, whereby electrical stability of the thin film transistor may be deteriorated. In addition, when the barrier layer 140 is thick, there is a possibility that oxygen vacancy may occur in the barrier layer 140, whereby driving property of the thin film transistor may become unstable.

In this way, when the barrier layer 140 becomes thick, the barrier layer 140 may cause an electrical defect of the thin film transistor.

For example, when the thickness of the barrier layer 140 exceeds 5 nm, an electron-hole pair may be formed in the barrier layer 140 or oxygen vacancy may occur, whereby electrical stability of the thin film transistor may be deteriorated due to the barrier layer 140, and the barrier layer 140 may cause an electrical defect. For example, when the thickness of the barrier layer 140 exceeds 5 nm, the barrier layer 140 may cause degradation caused by negative bias temperature illumination stress (NBTIS).

Therefore, according to one embodiment of the present disclosure, the thickness of the barrier layer 140 may be designed to be 5 nm or less.

In more detail, the barrier layer 140 may have a thickness of 1 nm to 3 nm. When the thickness of the barrier layer 140 is 1 nm or more, the barrier layer 140 may more efficiently protect the active layer 130. In addition, when the thickness of the barrier layer 140 is 3 nm or less, the barrier layer 140 may little affect or may not affect electrical characteristics of the active layer 130.

According to one embodiment of the present disclosure, the barrier layer 140 may have a thickness of, for example, 1.2 nm to 2.5 nm.

The first area 140a and the second area 140b of the barrier layer 140 may have the same thickness or their respective thicknesses different from each other.

Referring to FIG. 2, in the patterning process of the gate insulating layer 145, the second areas 140b of the barrier layer 140 may partially be lost. Therefore, according to one embodiment of the present disclosure, the first area 140a of the barrier layer 140 may have a thickness thicker than that of the second area 140b. Referring to FIG. 2, a thickness t1a of the first area 140a of the barrier layer 140 is thicker than a thickness t1b of the second area 140b (t1a>t1b).

In one embodiment of the present disclosure, there is no special limitation in a thickness ratio of the first area 140a and the second area 140b of the barrier layer 140. According to one embodiment of the present disclosure, the first area 140a and the second area 140b may have a thickness ratio of 1:0.3 to 1:0.9 (thickness of the first area:thickness of the second area). According to one embodiment of the present disclosure, the second area 140b of the barrier layer 140 may have a thickness of about 30% to 90% relative to the thickness of the first area 140a. However, one embodiment of the present disclosure is not limited to this embodiment. According to one embodiment of the present disclosure, the second area 140b may almost or all be removed, whereby the thickness of the second area 140b may not be measured substantially.

According to one embodiment of the present disclosure, since the barrier layer 140 is disposed on the active layer 130, even though a material of high mobility is used for development of a display apparatus of high quality, reliability and stability of the thin film transistor may be prevented from being deteriorated. In addition, since the barrier layer 140 according to one embodiment of the present disclosure may be disposed on the entire upper portion of the active layer 130 or on the entire upper portion of the substrate 110, the thin film transistor 100 may be manufactured without additional process of using a pattern mask.

Referring to FIGS. 1 and 2, the barrier layer 140 covers the channel portion 130a of the active layer 130, and also covers the first connection portion 130b and the second connection portion 130c, which are conductorized areas. The barrier layer 140 has a carrier concentration and mobility, which are lower than those of the active layer 130, and is insensitive to factors affecting stability of the thin film transistor 100 as compared with the channel portion 130a. Therefore, even though oxygen (O) or hydrogen (H), which is an external factor affecting electrical characteristics of the thin film transistor 100, is permeated into the barrier layer 140, there is no great change in electrical characteristics of the barrier layer 140. In this way, the barrier layer 140 serves to protect the active layer 130 from the external factors. As a result, electrical stability of the active layer 130 may be improved due to the barrier layer 140.

Figure 3:
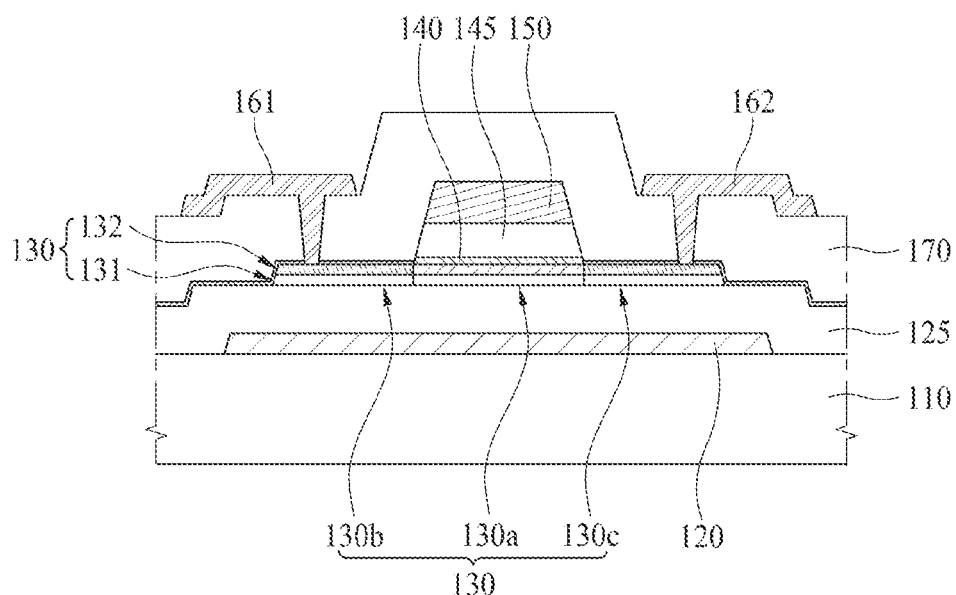
FIG. 3 is a cross-sectional view illustrating a thin film transistor according to another embodiment of the present disclosure according to one embodiment of the present disclosure.
Figure 4:
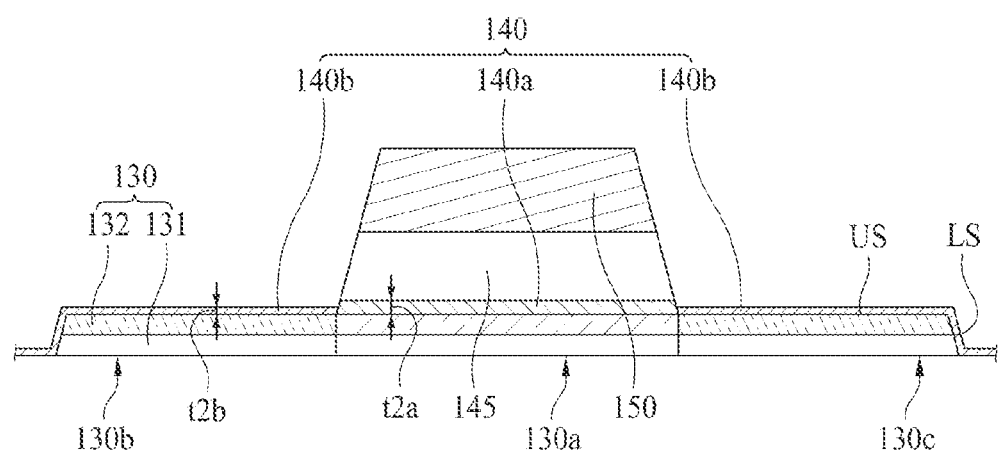
FIG. 4 is a detailed view illustrating a portion of FIG. 3 according to one embodiment of the present disclosure.

FIG. 3 is a cross-sectional view illustrating a thin film transistor 200 according to another embodiment of the present disclosure, and FIG. 4 is a detailed view illustrating a portion of FIG. 3 according to the other embodiment of the present disclosure.

Referring to FIG. 3, the active layer 130 includes a first oxide semiconductor layer 131, and a second oxide semiconductor layer 132 on the first oxide semiconductor layer 131.

The first oxide semiconductor layer 131 is disposed on the buffer layer 125, and may serve as a support layer for supporting the second oxide semiconductor layer 132. The second oxide semiconductor layer 132 may serve as a main channel layer.

The first oxide semiconductor layer 131 serving as a support layer may have excellent film stability and mechanical stability. The first oxide semiconductor layer 131 may include at least one of, for example, IGZO (InGaZnO)-based, IGO(InGaO)-based, IGZTO(InGaZnSnO)-based, GZTO(GaZnSnO)-based, GZO(GaZnO)-based or GO(GaO)-based oxide semiconductor material. However, one embodiment of the present disclosure is not limited to this example, and the first oxide semiconductor layer 131 may be made of another oxide semiconductor materials known in the art.

The second oxide semiconductor layer 132 may be made of an oxide semiconductor material such as, for example, IZO(InZnO)-based, FIZO(FeInZnO)-based, TO(SnO)-based, IGO(InGaO)-based, ITO(InSnO)-based, IGZO(InGaZnO)-based, IGZTO(InGaZnSnO)-based, GZTO (GaZnSnO)-based, or ITZO (InSnZnO)-based oxide semiconductor material. For example, the second oxide semiconductor layer 132 may include FIZO(FeInZnO)-based oxide semiconductor material. However, one embodiment of the present disclosure is not limited to this example, and the second oxide semiconductor layer 132 may be made of another oxide semiconductor materials known in the art.

In the thin film transistor 200 according to another embodiment of the present disclosure, the first oxide semiconductor layer 131 may have mobility of 5 $cm^2/V \cdot s$ or more. In detail, the first oxide semiconductor layer 131 may have mobility of 5 $cm^2/V \cdot s$ to 15 $cm^2/V \cdot s$. In addition, the channel portion 130a of the first oxide semiconductor layer 131 may have mobility of 5 $cm^2/V \cdot s$ or more, and may have mobility of 5 $cm^2/V \cdot s$ to 15 $cm^2/V \cdot s$.

In the thin film transistor 200 according to another embodiment of the present disclosure, the second oxide semiconductor layer 132 may have mobility of 10 $cm^2/V \cdot s$ or more, and may have mobility of 20 $cm^2/V \cdot s$ to 40 $cm^2/V \cdot s$. For example, the channel portion 130a of the second oxide semiconductor layer 132 may have mobility of 10 $cm^2/V \cdot s$ or more, and may have mobility of 20 $cm^2/V \cdot s$ to 40 $cm^2/V \cdot s$.

Referring to FIG. 4, the gate insulating layer 145 may be patterned. For example, the gate insulating layer 145 may be patterned in a shape corresponding to the gate electrode 150.

The barrier layer 140 is disposed between the active layer 130 and the gate insulating layer 145. Referring to FIGS. 3 and 4, the barrier layer 140 covers an upper surface US and a lateral surface LS of the active layer 130. In detail, the barrier layer 140 may be disposed on the upper surface US and the lateral surface LS of the active layer 130. In addition, the barrier layer 140 may be extended from the upper surface US and the lateral surface LS of the active layer 130 and disposed outside the active layer 130.

According to another embodiment of the present disclosure, the barrier layer 140 may include a first area 140a that overlaps the gate electrode 150, and a second area 140b that does not overlap the gate electrode 150.

According to another embodiment of the present disclosure, the first area 140a of the barrier layer 140 may have a thickness greater than a thickness of the second area 140b. Referring to FIG. 4, a thickness t2a of the first area 140a of the barrier layer 140 is greater than a thickness t2b of the second area 140b (t2a>t2b).

Figure 5:
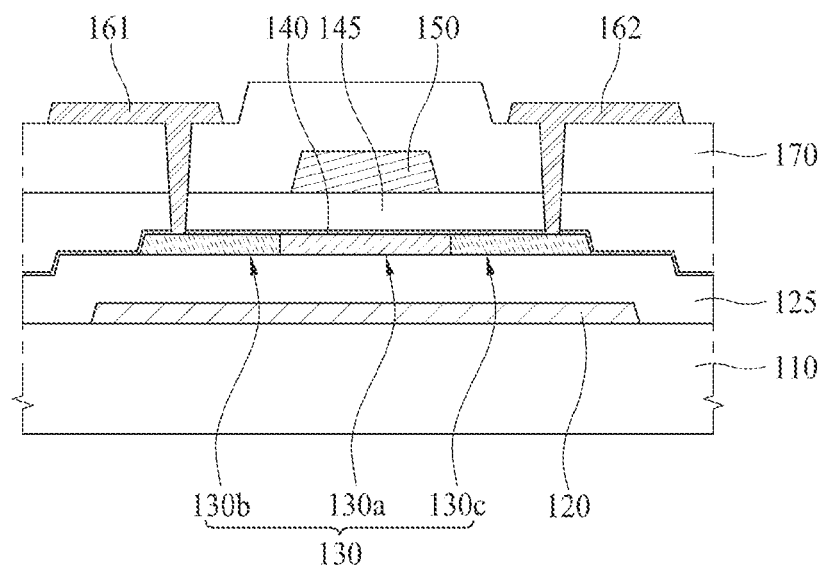
FIG. 5 is a cross-sectional view illustrating a thin film transistor according to still another embodiment of the present disclosure.

FIG. 5 is a cross-sectional view illustrating a thin film transistor 300 according to still another embodiment of the present disclosure.

Referring to FIG. 5, the gate insulating layer 145 is not patterned, and covers the entire upper surface of the active layer 130. The gate insulating layer 145 may cover an entire upper portion of the substrate 110.

When the gate insulating layer 145 is not patterned and covers the entire upper surface of the active layer 130, the active layer 130 may selectively be conductorized by doping using a dopant. As a result, even though the gate insulating layer 145 is not patterned, the first connection portion 130b and the second connection portion 130c of the active layer 130 may be formed.

The barrier layer 140 is disposed between the active layer 130 and the gate insulating layer 145. Referring to FIG. 5, the barrier layer 140 covers the upper surface and the lateral surface of the active layer 130. In addition, the barrier layer 140 may be extended from the upper surface and the lateral surface of the active layer 130 and disposed outside the active layer 130.

According to still another embodiment of the present disclosure, the barrier layer 140 may have the same thickness in an area overlapped with the gate electrode 150 and an area that is not overlapped with the gate electrode 150. In more detail, the barrier layer 140 includes a first area overlapped with the gate electrode 150 and a second area that is not overlapped with the gate electrode 150, wherein the first area and the second area may have the same thickness.

Figure 6:
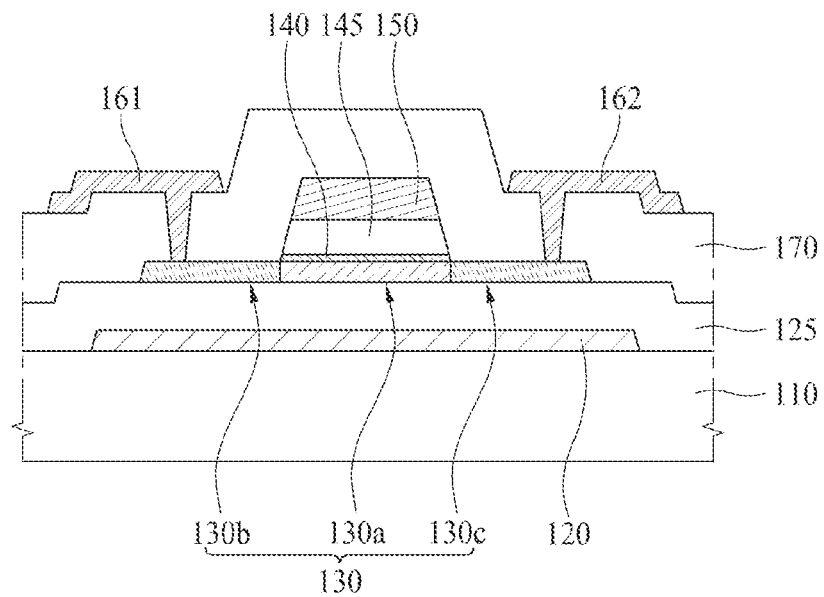
FIG. 6 is a cross-sectional view illustrating a thin film transistor according to further still another embodiment of the present disclosure.

FIG. 6 is a cross-sectional view illustrating a thin film transistor 400 according to further still another embodiment of the present disclosure.

Referring to FIG. 6, the barrier layer 140 is disposed between the active layer 130 and the gate insulating layer 145. Referring to FIG. 6, the gate insulating layer 145 may be patterned. For example, the gate insulating layer 145 may be patterned in a shape corresponding to the gate electrode 150.

Referring to FIG. 6, the barrier layer 140 may be lost during the patterning process of the gate insulating layer 145. Therefore, according to further still another embodiment of the present disclosure, as shown in FIG. 6, the barrier layer 140 may be formed only in an area overlapped with the gate insulating layer 145, and the barrier layer 140 may be removed in other areas. In the thin film transistor 400 shown in FIG. 6, the active layer 130 may include FIZO (FeInZnO)-based oxide semiconductor material. In more detail, the active layer 130 may be made of FIZO(FeInZnO)-based oxide semiconductor material.

Figure 7:
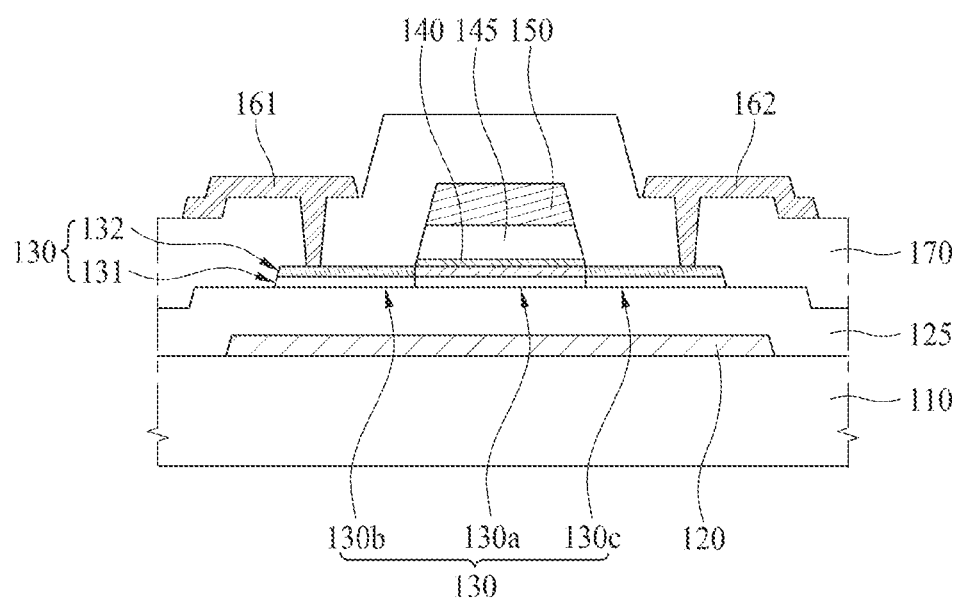
FIG. 7 is a cross-sectional view illustrating a thin film transistor according to further still another embodiment of the present disclosure.

FIG. 7 is a cross-sectional view illustrating a thin film transistor 500 according to further still another embodiment of the present disclosure.

Referring to FIG. 7, the active layer 130 includes a first oxide semiconductor layer 131, and a second oxide semiconductor layer 132 on the first oxide semiconductor layer 131.

The first oxide semiconductor layer 131 is disposed on the buffer layer 125, and may serve as a support layer for supporting the second oxide semiconductor layer 132. The second oxide semiconductor layer 132 may serve as a main channel layer. According to further still another embodiment of the present disclosure, the second oxide semiconductor layer 132 may include FIZO(FeInZnO)-based oxide semiconductor material.

Referring to FIG. 7, the gate insulating layer 145 may be patterned. For example, the gate insulating layer 145 may be patterned in a shape corresponding to the gate electrode 150.

The barrier layer 140 is disposed between the active layer 130 and the gate insulating layer 145. Referring to FIG. 7, the barrier layer 140 may be lost during the patterning process of the gate insulating layer 145. Therefore, according to further still another embodiment of the present disclosure, as shown in FIG. 7, the barrier layer 140 is formed only in an area overlapped with the gate insulating layer 145, and the barrier layer 140 may be removed in the other areas. According to further still another embodiment of the present disclosure, at least a portion of the barrier layer 140 may be removed in an area that is not overlapped with the gate insulating layer 145. Referring to FIG. 7, the barrier layer 140 may be disposed only on the channel portion 130a.

Figure 8:
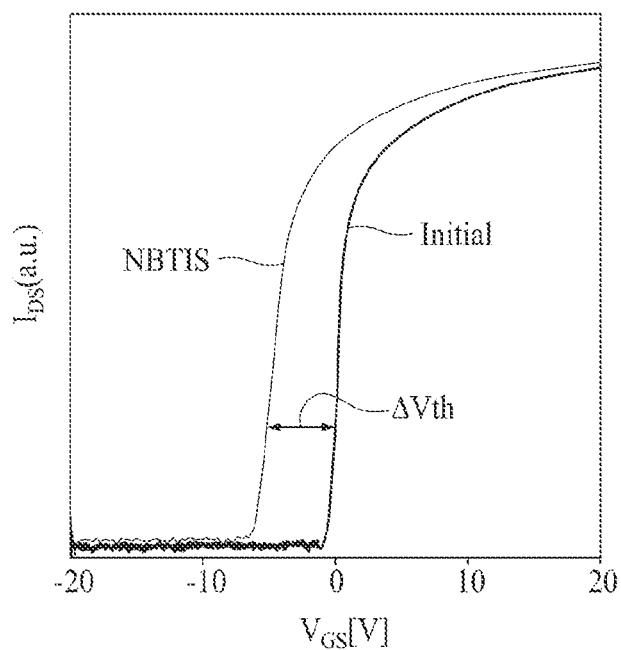
FIG. 8 is a graph illustrating a change of a threshold voltage of a thin film transistor according to a comparative example.
Figure 9:
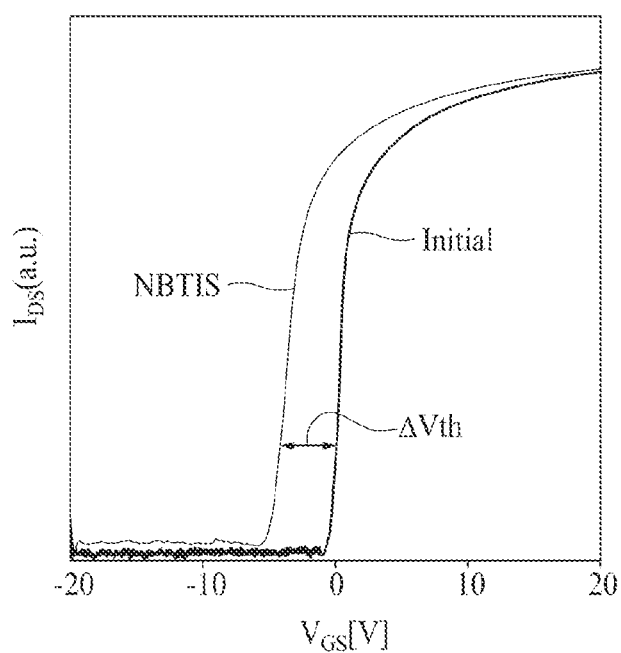
FIG. 9 is a graph illustrating a change of a threshold voltage of a thin film transistor according to another embodiment of the present disclosure.

FIG. 8 is a graph illustrating a change of a threshold voltage of a thin film transistor according to a comparative example, and FIG. 9 is a graph illustrating a change of a threshold voltage of a thin film transistor according to another embodiment of the present disclosure.

Regarding the graph shown in FIG. 9, the thin film transistor 200 according to another embodiment of the present disclosure has the structure shown in FIGS. 3 and 4. In detail, the graph shown in FIG. 9 is a threshold voltage graph for a thin film transistor in which IGZO(InGaZnO)-based oxide semiconductor layer of 20 nm is used as the first oxide semiconductor layer 131, IGZTO(InGaZnSnO)-based oxide semiconductor layer of 10 nm is used as the second oxide semiconductor layer 132 and IGZO(InGaZnO)-based oxide semiconductor material layer of 2.5 nm is used as the barrier layer 140.

The graph shown in FIG. 8 is a threshold voltage graph for a thin film transistor in which the barrier layer 140 is not used as compared with the graph shown in FIG. 9. In detail, the graph of FIG. 8 is a threshold voltage graph for a thin film transistor according to a comparative example in which IGZO(InGaZnO)-based oxide semiconductor layer of 20 nm is used as the first oxide semiconductor layer 131, IGZTO (InGaZnSnO)-based oxide semiconductor layer of 10 nm is used as the second oxide semiconductor layer 132 and the barrier layer 140 is not used.

In FIGS. 8 and 9, "initial" denotes a threshold voltage graph measured after the thin film transistor is manufactured, and "NBTIS" is a threshold voltage graph measured after a negative bias temperature illumination stress (NBTIS) test.

In detail, the NBTIS condition related to FIGS. 8 and 9 is a stress condition for applying a gate voltage of −30V for 1,000 seconds (1,000 sec) while irradiating visible light (white light) of 4500 nit to the thin film transistor at a temperature of 60° C.

Referring to FIG. 8, in the thin film transistor according to the comparative example, an initial threshold voltage Vth is −1.49V, and the threshold voltage Vth is −6.23V after the NBTIS test. It is noted from the NBTIS test that the threshold voltage of the thin film transistor according to the comparative example moves about −4.74V.

Referring to FIG. 9, in the thin film transistor 200 according to another embodiment of the present disclosure, the initial threshold voltage Vth is −1.47V, and the threshold voltage Vth is −5.39V after the NBTIS test. According to the NBTIS test, it is noted that the threshold voltage of the thin film transistor 200 according to another embodiment of the present disclosure moves about −3.92V.

In this way, in accordance with one embodiment of the present disclosure, when the barrier layer 140 is disposed on the active layer 130, it is noted that there is a little change in the threshold voltage Vth under the NBTIS stress condition as compared with the case that the barrier layer 140 is not disposed on the active layer 130. Therefore, the thin film transistors 100, 200, 300, 400 and 500 according to one embodiment of the present disclosure have excellent driving stability.

Figure 10:
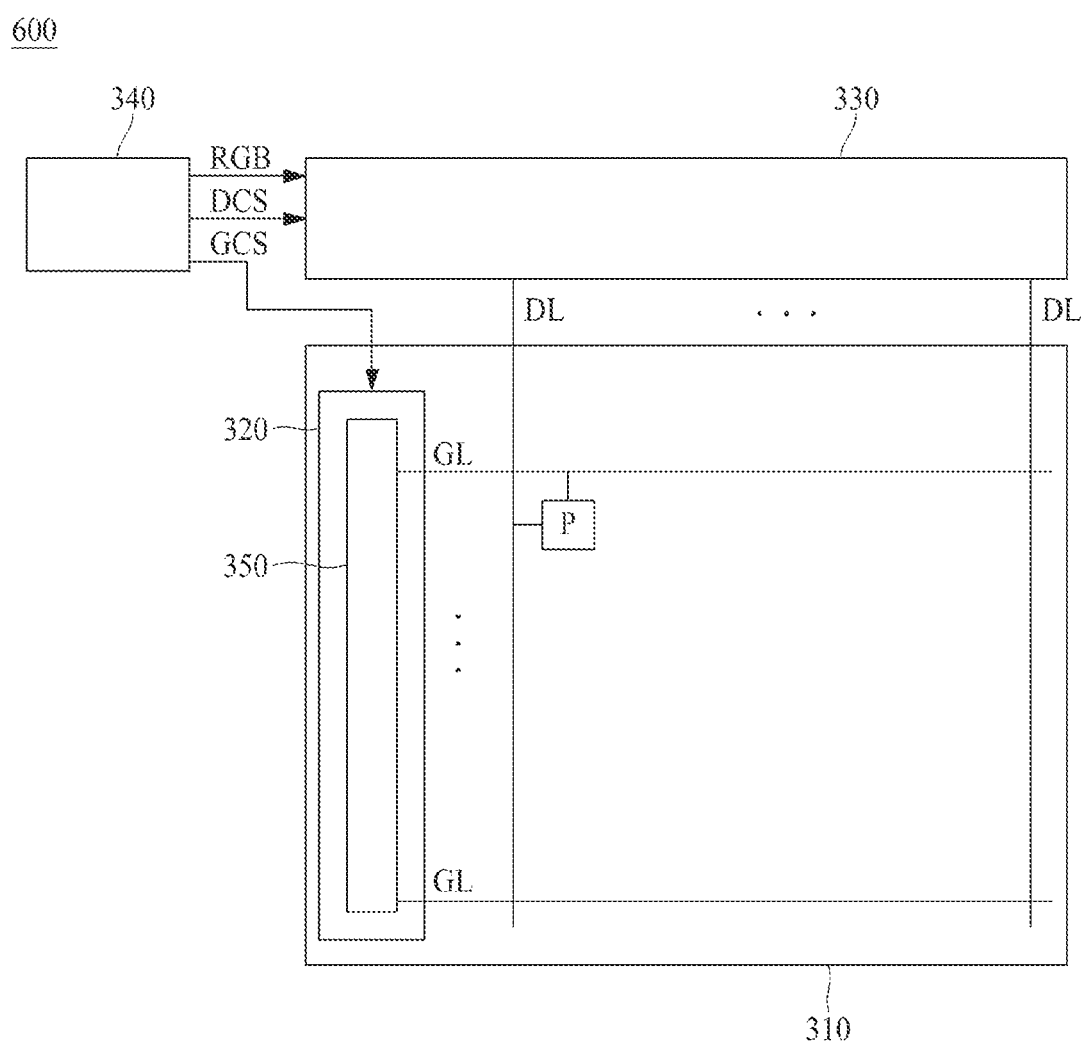
FIG. 10 is a schematic view illustrating a display apparatus according to an embodiment of the present disclosure.

FIG. 10 is a schematic view illustrating a display apparatus 600 according to one embodiment of the present disclosure.

As shown in FIG. 10, the display apparatus 600 includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P The controller 340 controls the gate driver 320 and the data driver 330.

The controller 340 outputs a gate control signal GCS for controlling the gate driver 320 and a data control signal DCS for controlling the data driver 330 by using a signal that is supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst, and a gate clock GCLK. Also, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage that may turn on a switching element (thin film transistor) disposed in the pixel P.

Also, the shift register 350 supplies a gate-off signal capable of turning off a switching element, to the gate line GL for the other period of one frame, in which the gate pulse is not supplied. Hereinafter, the gate pulse and the gate-off signal will collectively be referred to as a scan signal SS or Scan.

According to one embodiment of the present disclosure, the gate driver 320 may be packaged on the display panel 310. In this way, a structure in which the gate driver 320 is directly packaged on the display panel 310 will be referred to as a gate-in-panel (GIP) structure. The gate driver 320 may include at least one of the thin film transistors 100, 200, 300, 400 or 500 shown in FIGS. 1 to 7.

Figure 11:
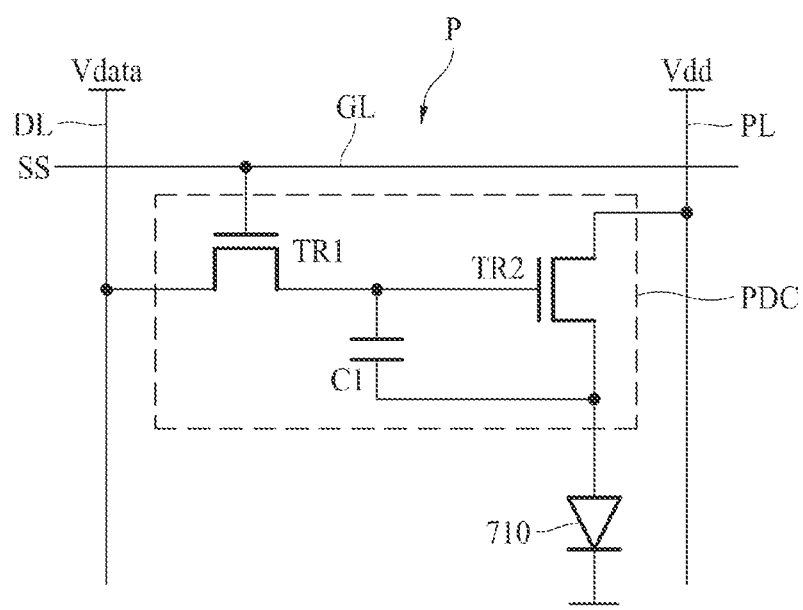
FIG. 11 is a circuit view illustrating any one pixel of FIG. 10 according to an embodiment of the present disclosure.
Figure 12:
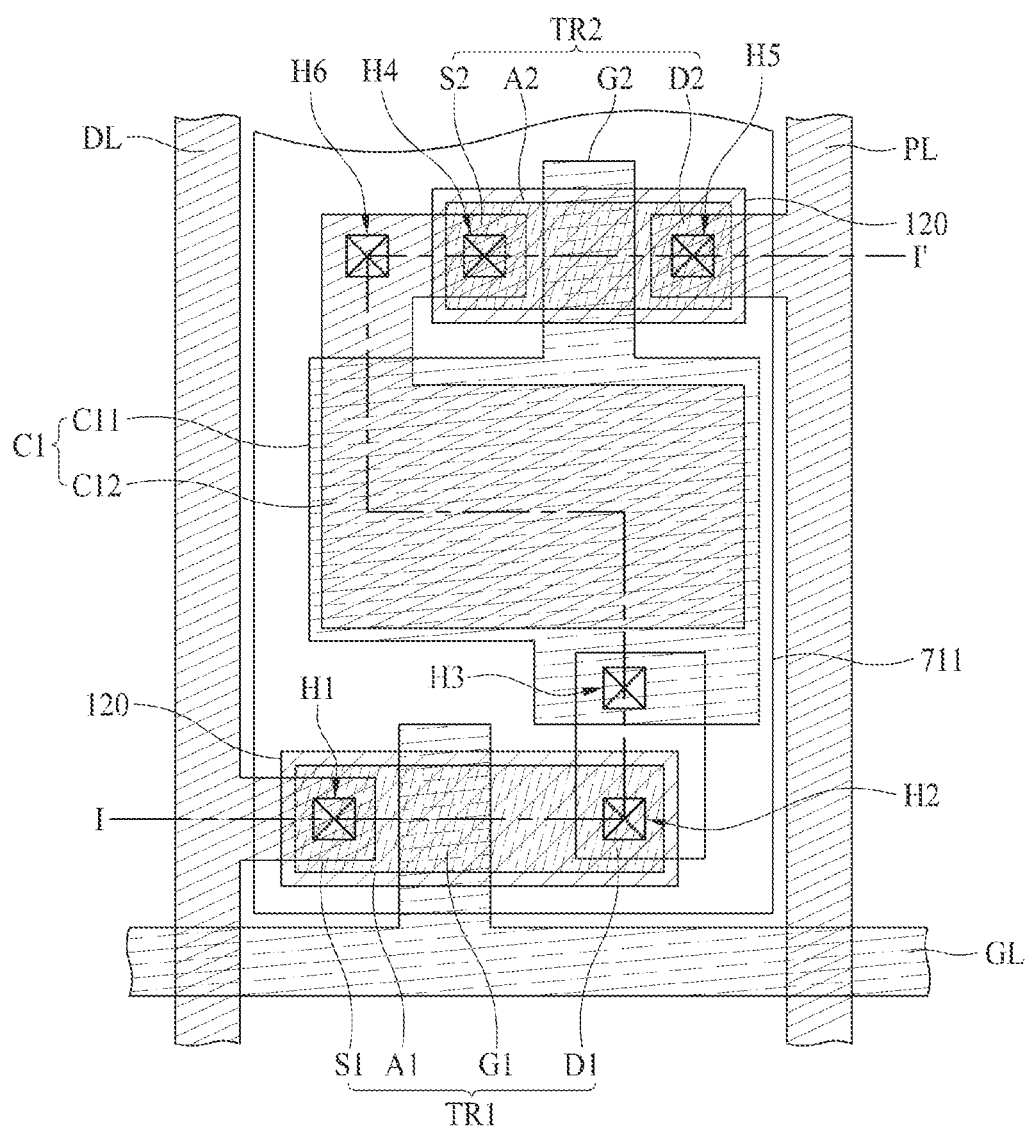
FIG. 12 is a plan view illustrating the pixel of FIG. 11 according to an embodiment of the present disclosure.
Figure 13:
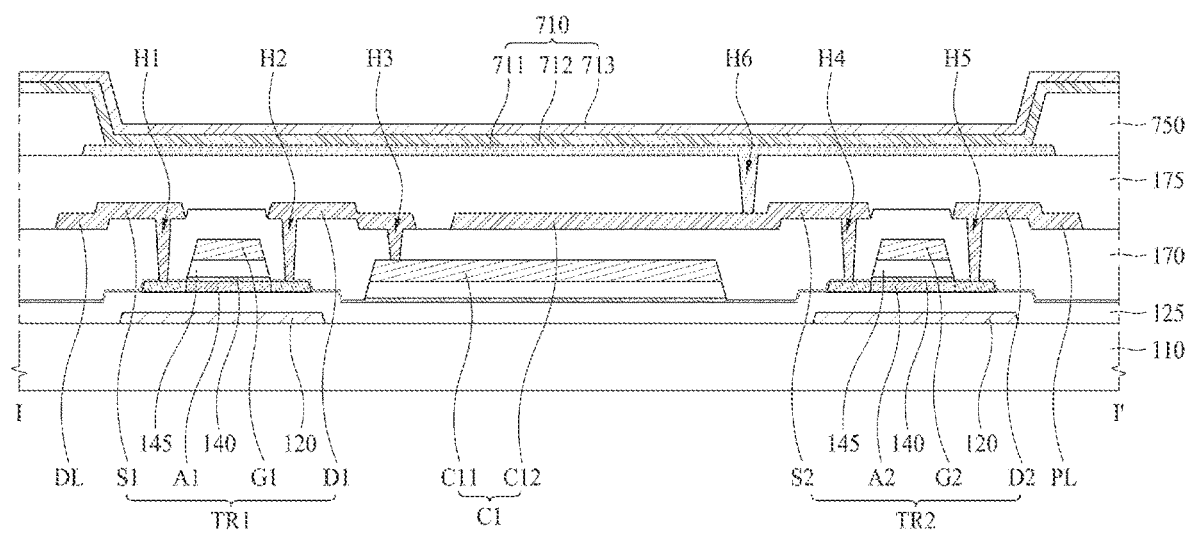
FIG. 13 is a cross-sectional view taken along line I-I' of FIG. 12 according to an embodiment of the present disclosure.

FIG. 11 is a circuit view illustrating any one pixel P of FIG. 10, FIG. 12 is a plan view illustrating the pixel P of FIG. 10, and FIG. 13 is a cross-sectional view taken along line I-I' of FIG. 12 according to one embodiment.

The circuit view of FIG. 11 is an equivalent circuit view for a pixel P of a display apparatus 600 that includes an organic light emitting diode (OLED) as a display element 710.

The pixel P includes a display element 710, and a pixel driving circuit PDC for driving the display element 710.

The pixel driving circuit PDC of FIG. 11 includes a first thin film transistor TR1 that is a switching transistor, and a second thin film transistor TR2 that is a driving transistor.

The display apparatus 600 according to another embodiment of the present disclosure may include at least one of the thin film transistors 100, 200, 300, 400 or 500 shown in FIGS. 1, 3, 5, 6 and 7. Any one of the thin film transistors 100, 200, 300, 400 and 500 shown in FIGS. 1, 3, 5, 6 and 7 may be used as the first thin film transistor TR1 or the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls applying of the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby gray scale of light emitted from the display element 710 may be controlled.

Referring to FIGS. 12 and 13, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

A light shielding layer 120 is disposed on the substrate 110. The light shielding layer 120 may shield light incident from the outside to protect active layers A1 and A2.

A buffer layer 125 is disposed on the light shielding layer 120. The buffer layer 125 is made of an insulating material and protects the active layers A1 and A2 from external moisture or oxygen.

The active layer A1 of the first thin film transistor TR1 and the active layer A2 of the second thin film transistor TR2 are disposed on the buffer layer 125.

Each of the active layers A1 and A2 includes an oxide semiconductor material. According to another embodiment of the present disclosure, the active layers A1 and A2 are oxide semiconductor layers made of an oxide semiconductor material.

A barrier layer 140 is disposed on the active layers A1 and A2. The barrier layer 140 may cover the entire upper surface of the active layers A1 and A2, or may cover only a portion of the active layers A1 and A2. The barrier layer 140 is disposed on the channel portion of the active layers A1 and A2 to protect the channel portion.

The barrier layer 140 includes an oxide semiconductor material, and has resistivity greater than that of the active layers A1 and A2. The barrier layer 140 may have the same or similar metal composition as that of the active layers A1 and A2. The barrier layer 140 has a thickness thinner than that of the active layers A1 and A2.

A gate insulating layer 145 is disposed on the barrier layer 140. The gate insulating layer 145 has insulation properties, and spaces the active layers A1 and A2 apart from the gate electrodes G1 and G2. A patterned gate insulating layer 145 is shown in FIG. 13, but another embodiment of the present disclosure is not limited thereto. The gate insulating layer 145 may not be patterned.

A gate electrode G1 of the first thin film transistor TR1 and a gate electrode G2 of the second thin film transistor TR2 are disposed on the gate insulating layer 145.

The gate electrode G1 of the first thin film transistor TR1 overlaps at least a portion of the active layer A1 of the first thin film transistor TR1. The gate electrode G2 of the second thin film transistor TR2 overlaps at least a portion of the active layer A2 of the second thin film transistor TR2.

The gate electrodes G1 and G2 also overlap the barrier layer 140.

Referring to FIGS. 12 and 13, a first capacitor electrode C11 of a first capacitor C1 is disposed in the same layer as the gate electrodes G1 and G2. The gate electrodes G1 and G2 and the first capacitor electrode C11 may be made together by the same process using the same material.

An interlayer dielectric layer 170 is disposed on the gate electrodes G1 and G2 and the first capacitor electrode C11.

The source electrodes S1 and S2 and the drain electrodes D1 and D2 are disposed on the interlayer dielectric layer 170. The source electrodes S1 and S2 and the drain electrodes D1 and D2 are distinguished for convenience of description, and the source electrodes S1 and S2 and the drain electrodes D1 and D2 may be used interchangeably. Therefore, the source electrodes S1 and S2 may be the drain electrodes D1 and D2, and the drain electrodes D1 and D2 may be the source electrodes S1 and S2.

A data line DL and a driving power line PL are disposed on the interlayer dielectric layer 170. The source electrode S1 of the first thin film transistor TR1 may integrally be formed with the data line DL. The drain electrode D2 of the second thin film transistor TR2 may integrally be formed with the driving power line PL.

According to one embodiment of the present disclosure, the source electrode S1 and the drain electrode D1 of the first thin film transistor TR1 are spaced apart from each other and connected with the active layer A1 of the first thin film transistor TR1. The source electrode S2 and the drain electrode D2 of the second thin film transistor TR2 are spaced apart from each other and connected with the active layer A2 of the second thin film transistor TR2.

In detail, the source electrode S1 of the first thin film transistor TR1 is in contact with a source area of the active layer A1 through a first contact hole H1.

The drain electrode D1 of the first thin film transistor TR1 is in contact with a drain area of the active layer A1 through a second contact hole H2, and is connected with the first capacitor electrode C11 of the first capacitor C1 through a third contact hole H3.

The source electrode S2 of the second thin film transistor TR2 is extended over the interlayer dielectric layer 170 and a portion thereof serves as a second capacitor electrode C12 of the first capacitor C1. The first capacitor electrode C11 and the second capacitor electrode C12 are overlapped with each other to form the first capacitor C1.

The source electrode S2 of the second thin film transistor TR2 is in contact with the source area of the active layer A2 through a fourth contact hole H4.

The drain electrode D2 of the second thin film transistor TR2 is in contact with the drain area of the active layer A2 through a fifth contact hole H5.

The first thin film transistor TR1 includes an active layer A1, a barrier layer 140, a gate electrode G1, a source electrode S1 and a drain electrode D1, and serves as a switching transistor for controlling a data voltage Vdata applied to the pixel driving circuit PDC.

The second thin film transistor TR2 includes an active layer A2, a barrier layer 140, a gate electrode G2, a source electrode S2 and a drain electrode D2, and serves as a driving transistor for controlling a driving voltage Vdd applied to the display element 710.

A passivation layer 175 is disposed on the source electrodes S1 and S2, the drain electrodes D1 and D2, the data line DL and the driving power line PL. The passivation layer 175 planarizes upper portions of the first thin film transistor TR1 and the second thin film transistor TR2 and protects the first thin film transistor TR1 and the second thin film transistor TR2.

A first electrode 711 of the display element 710 is disposed on the passivation layer 175. The first electrode 711 of the display element 710 is connected with the source electrode S2 of the second thin film transistor TR2 through a sixth contact hole H6 formed in the passivation layer 175.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 13 is an organic light emitting diode (OLED). Therefore, the display apparatus 600 according to one embodiment of the present disclosure is an organic light emitting display apparatus.

Figure 14:
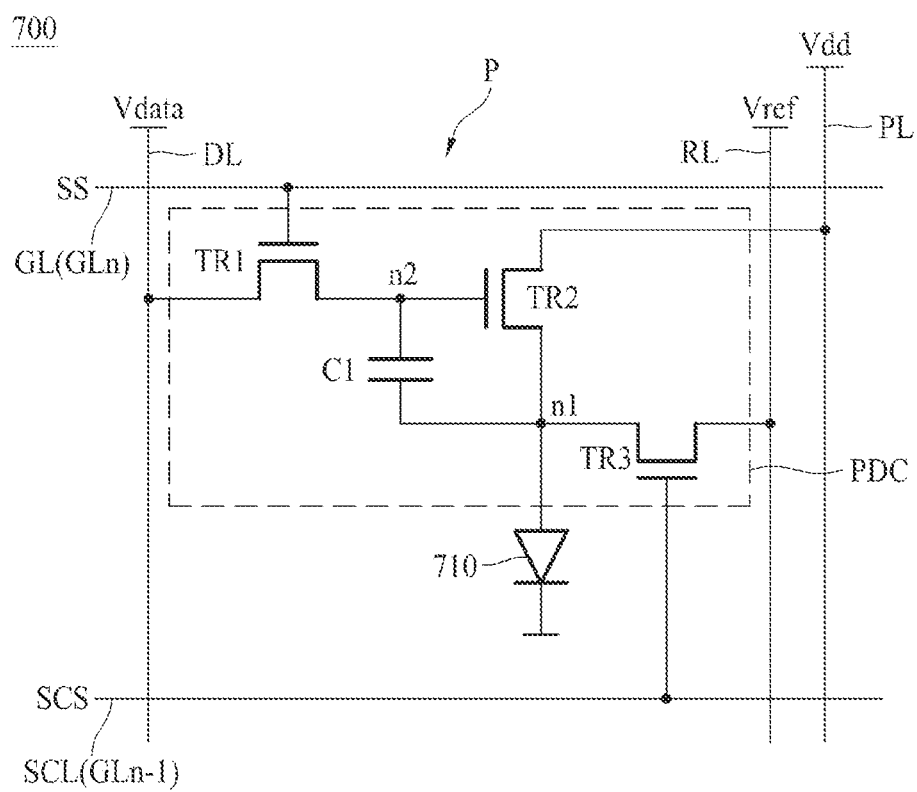
FIG. 14 is a circuit view illustrating a pixel of a display apparatus according to another embodiment of the present disclosure.

FIG. 14 is a circuit view illustrating a pixel P of a display apparatus 700 according to another embodiment of the present disclosure.

FIG. 14 is an equivalent circuit view illustrating a pixel P of an organic light emitting display apparatus.

The pixel P of the display apparatus 700 shown in FIG. 14 includes an organic light emitting diode (OLED) that is a display element 710, and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 14, assuming that a gate line of an nth pixel P is "$GL_n$", a gate line of a (n−1)th pixel P adjacent to the nth pixel P is "$GL_{n-1}$", and the gate line "$GL_{n-1}$" of the (n−1)th pixel P serves as a sensing control line SCL of the nth pixel P.

The pixel driving circuit PDC, for example, includes a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is disposed between a gate electrode G2 of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display element 710 and the reference line RL and thus turned on or off by the sensing control signal SCS, and senses characteristics of the second thin film transistor TR2, which is a driving transistor, for a sensing period.

A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

The display apparatus 700 according to another embodiment of the present disclosure may include at least one of the thin film transistors 100, 200, 300, 400 or 500 shown in FIGS. 1, 3, 5, 6 and 7.

Figure 15:
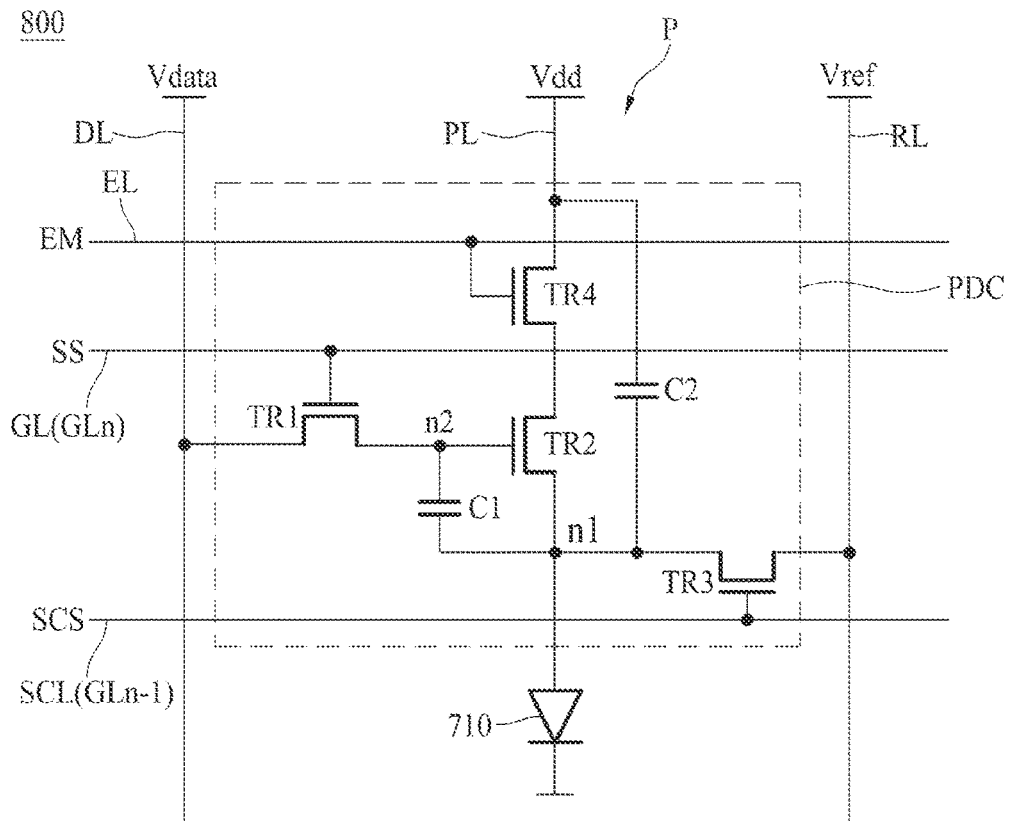
FIG. 15 is a circuit view illustrating any one pixel of a display apparatus according to still another embodiment of the present disclosure.

FIG. 15 is a circuit view illustrating a pixel of a display apparatus 800 according to still another embodiment of the present disclosure.

The pixel P of the display apparatus 800 shown in FIG. 15 includes an organic light emitting diode (OLED) that is a display element 710, and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 14, the pixel P of FIG. 15 further includes an emission control line EL. An emission control signal EM is supplied to the emission control line EL.

Also, the pixel driving circuit PDC of FIG. 15 further includes a fourth thin film transistor TR4 that is an emission control transistor for controlling a light emission timing of the display element 710, in comparison with the pixel driving circuit PDC of FIG. 14.

Referring to FIG. 15, assuming that a gate line of an nth pixel P is "$GL_n$", a gate line of a (n−1)th pixel P adjacent to the nth pixel P is "$GL_{n-1}$", and the gate line "$GL_{n-1}$" of the (n−1)th pixel P serves as a sensing control line SCL of the nth pixel P.

A first capacitor C1 is positioned between the gate electrode G2 of the second thin film transistor TR2 and the display element 710. A second capacitor C2 is positioned between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to the reference line RL and thus turned on or off by the sensing control signal SCS, and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM, or shields the driving voltage Vdd. When the fourth thin film transistor TR4 is turned on, a current is supplied to the second thin film transistor TR2, whereby light is output from the display element 710.

The display apparatus 800 according to still another embodiment of the present disclosure may include at least one of the thin film transistors 100, 200, 300, 400 or 500 shown in FIGS. 1, 3, 5, 6 and 7.

The pixel driving circuit PDC according to still another embodiment of the present disclosure may be formed in various structures in addition to the above-described structure. The pixel driving circuit PDC, for example, may include five or more thin film transistors.

Figure 16:
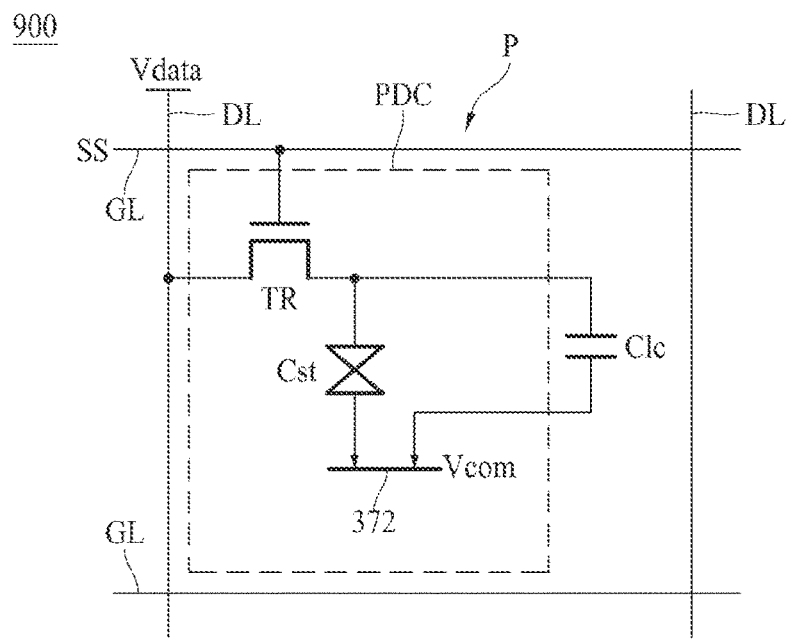
FIG. 16 is a circuit view illustrating any one pixel of a display apparatus according to further still another embodiment of the present disclosure.

FIG. 16 is a circuit view illustrating a pixel P of a display apparatus 900 according to further still another embodiment of the present disclosure.

The display apparatus 900 of FIG. 16 is a liquid crystal display apparatus.

The pixel P of the display apparatus 900 shown in FIG. 16 includes a pixel driving circuit PDC, and a liquid crystal capacitor C1c connected with the pixel driving circuit PDC. The liquid crystal capacitor C1c corresponds to a display element.

The pixel driving circuit PDC includes a thin film transistor TR connected with the gate line GL and the data line DL, and a storage capacitor Cst connected between the thin film transistor TR and a common electrode 372. The liquid crystal capacitor C1c is connected with the storage capacitor Cst in parallel between the thin film transistor TR and the common electrode 372.

The liquid crystal capacitor C1c is charged with a differential voltage between a data signal supplied to a pixel electrode through the thin film transistor TR and a common voltage Vcom supplied to the common electrode 372, and controls a light-transmissive amount by driving liquid crystals in accordance with the charged voltage. The storage capacitor Cst stably maintains the voltage charged in the liquid crystal capacitor C1c.

The display apparatus 900 according to further still another embodiment of the present disclosure may include at least one of the thin film transistors 100, 200, 300, 400 or 500 shown in FIGS. 1, 3, 5, 6 and 7.

According to the present disclosure, the following advantageous effects may be obtained.

According to one embodiment of the present disclosure, the thin barrier layer of high resistance, which is made of an oxide semiconductor material, is disposed on the active layer, whereby driving stability of the thin film transistor may be improved.

According to one embodiment of the present disclosure, the thin barrier layer of high resistance, which is thin and made of an oxide semiconductor material, is disposed on the active layer, whereby the change in the threshold voltage of the thin film transistor may be minimized.

According to another embodiment of the present disclosure, the barrier layer made of an oxide semiconductor material having a high oxygen concentration is disposed on the active layer, whereby interface stability between the gate insulating layer and the active layer may be improved, and as a result, stability of the thin film transistor may be improved.

According to another embodiment of the present disclosure, even though an oxide semiconductor material having high mobility characteristics is used, driving stability of the thin film transistor may be improved by disposing the barrier layer on the active layer without using a new insulating layer or adding a new element.

According to another embodiment of the present disclosure, a thin film transistor including an active layer made of an oxide semiconductor material having high mobility characteristics may be manufactured without an additional process using a mask.

Since the display apparatus according to one embodiment of the present disclosure includes the above-described thin film transistor, stable display performance may be exerted.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:
1. A thin film transistor comprising:
an active layer including an oxide semiconductor material;
a barrier layer on the active layer;
a gate insulating layer on the barrier layer; and
a gate electrode on the gate insulating layer, wherein at least a portion of the gate electrode overlaps at least a portion of the active layer, and the barrier layer includes an oxide semiconductor material and has a resistivity that is greater than a resistivity of the active layer and has a thickness that is less than a thickness of the active layer, wherein the barrier layer includes a first area overlapped with the gate electrode and a second area that is not overlapped with the gate electrode, and the first area has a thickness greater than a thickness of the second area.

2. The thin film transistor of claim 1, wherein the barrier layer includes at least one of IGZO(InGaZnO)-based oxide semiconductor material, IGO(InGaO)-based oxide semiconductor material, IGZTO(InGaZnSnO)-based oxide semiconductor material, GZTO(GaZnSnO)-based oxide semiconductor material, GZO(GaZnO)-based oxide semiconductor material, or GO(GaO)-based oxide semiconductor material.

3. The thin film transistor of claim 1, wherein the resistivity of the barrier layer is $1.0 \times 10^6 \Omega \cdot cm$ or more.

4. The thin film transistor of claim 1, wherein the barrier layer has a carrier concentration less than a carrier concentration of the active layer.

5. The thin film transistor of claim 1, wherein the barrier layer has a carrier concentration of $1.0 \times 10^{17}$ ea/cm$^3$ or less.

6. The thin film transistor of claim 1, wherein the barrier layer has a mobility of 1 to 2 cm$^2$/V·s.

7. The thin film transistor of claim 1, wherein the barrier layer has an oxygen atom concentration greater than an oxygen atom concentration of the active layer.

8. The thin film transistor of claim 1, wherein the barrier layer includes metal atoms and oxygen atoms, and
a number of oxygen atoms in the barrier layer is 1.2 to 2.5 times of a total number of metal atoms in the barrier layer.

9. The thin film transistor of claim 1, wherein the thickness of the barrier layer is 0.5 nm to 5 nm.

10. The thin film transistor of claim 1, wherein the thickness of the barrier layer is 1 nm to 3 nm.

11. The thin film transistor of claim 1, wherein the barrier layer covers an upper surface and a lateral surface of the active layer.

12. The thin film transistor of claim 11, wherein the barrier layer extends to outside of the active layer.

13. The thin film transistor of claim 1, wherein a thickness ratio of a thickness of the first area and a thickness of the second area is 1:0.3 to 1:0.9.

14. The thin film transistor of claim 1, wherein the barrier layer is disposed between the active layer and the gate insulating layer.

15. The thin film transistor of claim 1, wherein the gate insulating layer is patterned.

16. The thin film transistor of claim 1, wherein the active layer includes:
a first oxide semiconductor layer; and
a second oxide semiconductor layer on the first oxide semiconductor layer.

17. The thin film transistor of claim 16, wherein the second oxide semiconductor layer includes FIZO(FeInZnO)-based oxide semiconductor material.

18. The thin film transistor of claim 16, wherein the barrier layer is disposed between the second oxide semiconductor layer and the gate insulating layer.

19. The thin film transistor of claim 18, wherein the gate insulating layer is patterned to correspond to the gate electrode.

20. The thin film transistor of claim 19, wherein the barrier layer is not disposed in an area outside of the gate insulating layer.

21. The thin film transistor of claim 16, wherein the barrier layer is disposed only on a channel portion.

22. A thin film transistor comprising:
an active layer including an oxide semiconductor material;
a barrier layer on the active layer, wherein the barrier layer is a distinct layer from the active layer;
a gate insulating layer on the barrier layer; and
a gate electrode on the gate insulating layer,
wherein at least a portion of the gate electrode overlaps at least a portion of the active layer, and
the barrier layer includes an oxide semiconductor material having a carrier concentration that is less than a carrier concentration of the oxide semiconductor material included in the active layer,
wherein the barrier layer includes a first area overlapped with the gate electrode and a second area that is not overlapped with the gate electrode, and the first area has a thickness greater than a thickness of the second area.

23. The thin film transistor of claim 22, wherein the carrier concentration of the oxide semiconductor material included in the barrier layer is $1.0 \times 10^{17}$ ea/cm$^3$ or less.

24. The thin film transistor of claim 22, wherein an oxygen atom concentration of the oxide semiconductor material included in the barrier layer is greater than an oxygen atom concentration of the oxide semiconductor material included in the active layer.

25. The thin film transistor of claim 22, wherein the barrier layer is thinner than the active layer.

26. The thin film transistor of claim 22, wherein the active layer includes:
a first oxide semiconductor layer; and
a second oxide semiconductor layer on the first oxide semiconductor layer.

27. The thin film transistor of claim 22, wherein the barrier layer covers an upper surface and side surfaces of the active layer.

28. A thin film transistor comprising:
an active layer including an oxide semiconductor material;
a barrier layer on the active layer;
a gate insulating layer on the barrier layer; and
a gate electrode on the gate insulating layer,
wherein at least a portion of the gate electrode overlaps at least a portion of the active layer, and
the barrier layer includes an oxide semiconductor material and has a resistivity that is greater than a resistivity of the active layer and has a thickness that is less than a thickness of the active layer, and
wherein the barrier layer has an oxygen atom concentration greater than an oxygen atom concentration of the active layer.

* * * * *